United States Patent
Wang et al.

(10) Patent No.: US 8,470,390 B2
(45) Date of Patent: Jun. 25, 2013

(54) OXIDATION-FREE COPPER METALLIZATION PROCESS USING IN-SITU BAKING

(75) Inventors: Yu-Sheng Wang, Tainan (TW); Shih-Ho Lin, Jhubei (TW); Kei-Wei Chen, Taipei (TW); Szu-An Wu, Tainan (TW); Ying-Lang Wang, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 821 days.

(21) Appl. No.: 11/972,785

(22) Filed: Jan. 11, 2008

(65) Prior Publication Data

US 2009/0181164 A1 Jul. 16, 2009

(51) Int. Cl.
*B05D 5/12* (2006.01)
*C23C 14/00* (2006.01)

(52) U.S. Cl.
USPC ............................ 427/97.7; 427/534; 427/535

(58) Field of Classification Search
USPC ...................................... 427/97.7, 534, 535
See application file for complete search history.

(56) References Cited

U.S. PATENT DOCUMENTS

| | | | |
|---|---|---|---|
| 6,177,347 B1* | 1/2001 | Liu et al. | 438/675 |
| 6,218,303 B1* | 4/2001 | Lin | 438/687 |
| 2002/0098685 A1* | 7/2002 | Sophie et al. | 438/633 |
| 2005/0054202 A1* | 3/2005 | Pan et al. | 438/694 |
| 2005/0233572 A1* | 10/2005 | Su et al. | 438/618 |
| 2007/0134899 A1* | 6/2007 | Kanki et al. | 438/597 |

\* cited by examiner

*Primary Examiner* — Brian K Talbot
(74) *Attorney, Agent, or Firm* — Slater & Matsil, L.L.P.

(57) ABSTRACT

A method of forming an integrated circuit structure includes providing a substrate; forming a metal feature over the substrate; forming a dielectric layer over the metal feature; and forming an opening in the dielectric layer. At least a portion of the metal feature is exposed through the opening. An oxide layer is accordingly formed on an exposed portion of the metal feature. The method further includes, in a production tool having a vacuum environment, performing an oxide-removal process to remove the oxide layer. Between the step of forming the opening and the oxide-removal process, no additional oxide-removal process is performed to the metal feature outside the production tool. The method further includes, in the production tool, forming a diffusion barrier layer in the opening, and forming a seed layer on the diffusion barrier layer.

20 Claims, 9 Drawing Sheets

OXIDATION-FREE COPPER METALLIZATION PROCESS USING IN-SITU BAKING

TECHNICAL FIELD

This invention is related generally to integrated circuits, and more particularly to structures and formation methods of interconnect structures, and even more particularly to the removal of copper oxides on metal lines.

BACKGROUND

In integrated circuit art, a commonly used method for forming interconnect structures, which include metal lines and vias, is known as "damascene." Generally, this method involves forming an opening in a dielectric layer, which separates the vertically spaced metallization layers. The opening is typically formed using conventional lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

Copper is commonly used in damascene structures because of its low resistivity. Typically, an interconnect structure is formed of a plurality of metallization layers, each including a plurality of copper lines. Copper lines in different metallization layers are interconnected by vias. During the formation of one metallization layer, the underlying metallization layer will typically have portions exposed to open air.

Figure 1:
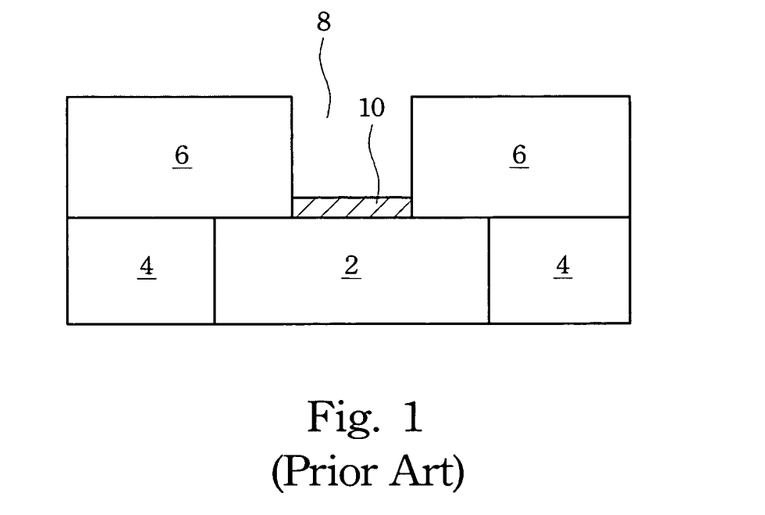
FIG. 1 illustrates a cross-sectional view of an intermediate structure in the formation of a conventional damascene structure, wherein a copper oxide layer is formed on the top surface of a copper line.

FIG. 1 illustrates a cross-sectional view of an intermediate stage in the formation of a conventional damascene structure. Copper line 2 is formed in dielectric layer 4. Dielectric layer 6 is formed over copper line 2 and dielectric layer 4. Opening 8 is then formed (using a patterned photo resist (not shown)) in dielectric layer 6 to expose the underlying copper line 2. The formation of opening 8 is performed in open air. Affected by oxygen and moisture in the air, an exposed portion of copper line 2 is oxidized, forming copper oxide layer 10. After the formation of opening 8, the photo resist is removed by ashing. The photo resist ashing process may further increase the thickness of copper oxide layer 10. Copper oxide layer 10 adversely affects the electrical conduction between metal line 2 and the subsequently formed metal feature in opening 8, and thus has to be removed.

Conventionally, a furnace baking is performed to remove copper oxide layer 10. The furnace baking is performed at a pressure of one atmosphere, with hydrogen introduced into the furnace. With an elevated temperature, copper oxide layer 10 is reduced to copper, while the oxygen in copper oxide layer 10 reacts with hydrogen to form water ($H_2O$). Typically, the furnace baking may last two hours or even longer.

The wafer containing the structure shown in FIG. 1 is then transferred to a vacuum environment to form a barrier layer and a copper seed layer. However, during the transferring, the wafer is exposed to open air, and hence a thin copper oxide layer is formed again on the exposed portion of copper line 2. Also, moisture may be trapped in the wafer. The Q-time, which is the time the wafer is exposed to open air, needs to be tightly controlled to reduce the thickness of the copper oxide layer. The controlling of the Q-time, however, can only make the copper oxide thinner, but cannot eliminate its formation. Therefore, in the vacuum environment, an additional removal process is performed to remove the thin copper oxide layer. The removal of the thin copper oxide layer may include a degas process (at an elevated temperature with no hydrogen introduced) to remove moisture, and a plasma clean at room temperature (with hydrogen as a process gas) to remove the thin copper oxide layer.

With a long furnace baking time and the additional copper oxide removal process in the vacuum environment, the throughput of the manufacturing process is adversely affected. The seemingly redundant, however necessary, copper removal processes also result in the increase in the manufacturing cost. New methods are thus needed to increase the throughput and to reduce the manufacturing cost.

SUMMARY OF THE INVENTION

In accordance with one aspect of the present invention, a method of forming an integrated circuit structure includes providing a substrate; forming a metal feature over the substrate; forming a dielectric layer over the metal feature; and forming an opening in the dielectric layer. At least a portion of the metal feature is exposed through the opening. An oxide layer is accordingly formed on an exposed portion of the metal feature. The method further includes, in a production tool having a vacuum environment, performing an oxide-removal process to remove the oxide layer. Between the step of forming the opening and the oxide-removal process, no additional oxide-removal process is performed to the metal feature outside the production tool. The method further includes, in the production tool, forming a diffusion barrier layer in the opening, and forming a seed layer on the diffusion barrier layer.

In accordance with another aspect of the present invention, a method of forming an integrated circuit structure includes providing a substrate; forming a metal feature over the substrate; forming a dielectric layer over the metal feature; and forming an opening in the dielectric layer. At least a portion of the metal feature is exposed through the opening. Accordingly, an oxide layer is formed on an exposed portion of the metal feature. The method further includes, in a production tool having a vacuum environment, baking the substrate, wherein a process gas for reducing the oxide layer to metal is introduced to the production tool when the substrate is being baked. The method further includes forming a diffusion barrier layer in the opening; and forming a seed layer on the diffusion barrier layer, wherein the steps of forming the diffusion barrier layer and forming the seed layer are performed in the production tool.

In accordance with yet another aspect of the present invention, a method of forming an integrated circuit structure includes providing a substrate; providing a production tool including a baking chamber, a first and a second deposition chamber, and a transfer chamber for transferring wafers between the baking chamber and the first and the second deposition chambers; forming a first dielectric layer over the substrate; forming a copper line in the first dielectric layer; forming a second dielectric layer over the copper line and the first dielectric layer, wherein the second dielectric layer has a low k value; forming an opening in the second dielectric layer, wherein at least a portion of the copper line is exposed through the opening, and wherein a copper oxide layer is formed on an exposed portion of the copper line; baking the substrate in the first deposition chamber of the production tool, wherein hydrogen is introduced into the first chamber during the step of baking; transferring the substrate from the baking chamber to the first deposition chamber through the transfer chamber, wherein no vacuum break occurs in the production tool; in the first deposition chamber, forming a diffusion barrier layer in the opening; transferring the substrate from the first deposition chamber to the second deposition chamber through the transfer chamber, wherein no vacuum break occurs in the production tool; in the second deposition chamber, forming a seed layer on the diffusion barrier layer; and plating copper on the seed layer to fill the opening.

An advantageous feature of the present invention is that only one short oxide-removal is needed. Thus, the manufacturing cost is reduced, and the quality of the resulting interconnect structure is not sacrificed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for forming metal features in metallization layers of integrated circuits are provided. The intermediate stages of manufacturing embodiments of the present invention are illustrated. Throughout various views and illustrative embodiments of the present invention, like reference numbers are used to designate like elements.

Figure 2:
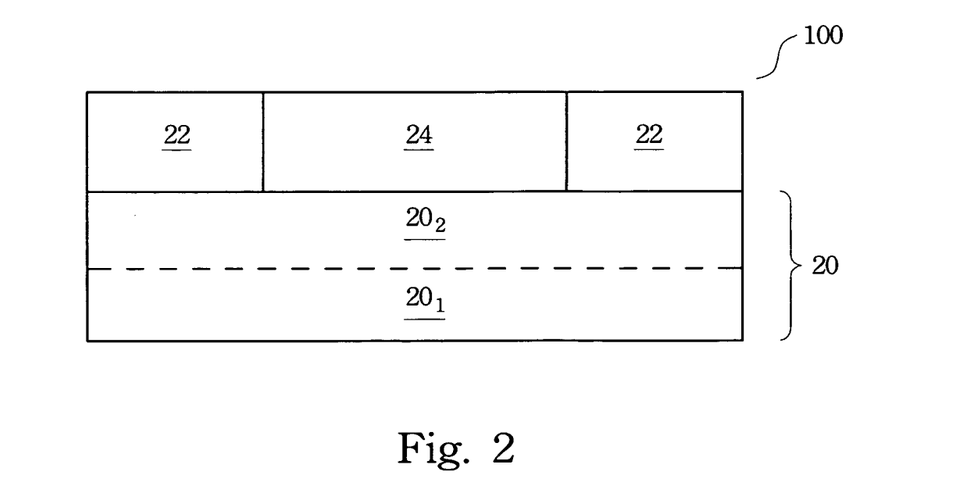
FIGS. 2 through 5 and FIGS. 7 through 10 are cross-sectional views of intermediate stages in the manufacturing of an interconnect structure, wherein an oxide removal process is performed in a vacuum environment.

Referring to FIG. 2, wafer 100 is provided, which includes schematically illustrated base structure 20, and dielectric layer 22 over base structure 20. Base structure 20 may include a semiconductor substrate, referred to herein as $20_1$, and overlying layers $20_2$, which may include a contact etch stop layer (ESL), an inter-layer dielectric (ILD), and inter-metal dielectrics (IMD), in which metallization layers (not shown) are formed. Semiconductor substrate $20_1$ may be a single crystalline or a compound semiconductor substrate. Active and passive devices (not shown), such as transistors, resistors, and inductors, may be formed on semiconductor substrate $20_1$.

In an embodiment, dielectric layer 22 is an interlayer dielectric layer, and may be formed of borophosphosilicate glass (BPSG) or other dielectric materials. In other embodiments, dielectric layer 22 is an inter-metal dielectric layer, which may be formed of a low-k dielectric having a k value of less than about 3.5, and more preferably less than about 2.8. Metal feature 24 is formed in dielectric layer 22. In the preferred embodiment, metal feature 24 is formed of copper or a copper alloy, and hence is referred to as copper feature 24 throughout the description. Alternatively, metal feature 24 is formed of other metals suffering from oxidation if exposed to oxygen and/or moisture. Depending on which dielectric layer the metal feature 24 is located, metal feature 24 may be a contact plug or a copper line.

Figure 3:
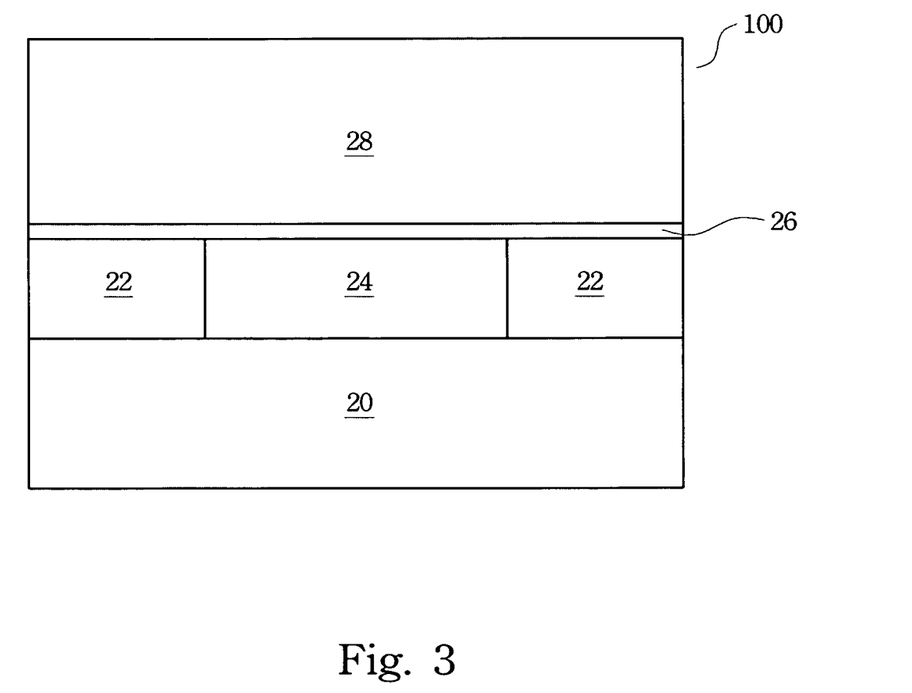

FIG. 3 illustrates the formation of etch stop layer 26 on metal feature 24 and dielectric layer 22, followed by the formation of dielectric layer 28. In an exemplary embodiment, dielectric layer 28 has a low dielectric constant (k value), preferably lower than about 3.5, hence is referred to as low-k dielectric layer 28 throughout the description. More preferably, low-k dielectric layer 28 has a k value of less than about 2.8, and hence is sometimes referred to as an extra low-k (ELK) dielectric layer. Low-k dielectric layer 28 may include commonly used materials such as fluorinated silicate glass (FSG), carbon-containing dielectric materials, and may further contain nitrogen, hydrogen, oxygen, and combinations thereof. A porous structure may exist in low-k dielectric layer 28 for lowering its k value. The thickness of low-k dielectric layer 28 may be between about 1000 Å and about 1 µm, although it may also be greater or smaller. One skilled in the art will realize, however, that the dimensions recited throughout the description are related to the technology used for forming the integrated circuits, and may be scaled to suit the scale of the forming technology. Low-k dielectric layer 28 may be formed using chemical vapor deposition, spin-on, or other commonly used methods. As is known in the art, an interconnect structure on a wafer may include up to about nine metallization layers, and low-k dielectric layer 28 may belong to any of the metallization layers.

Figure 4:
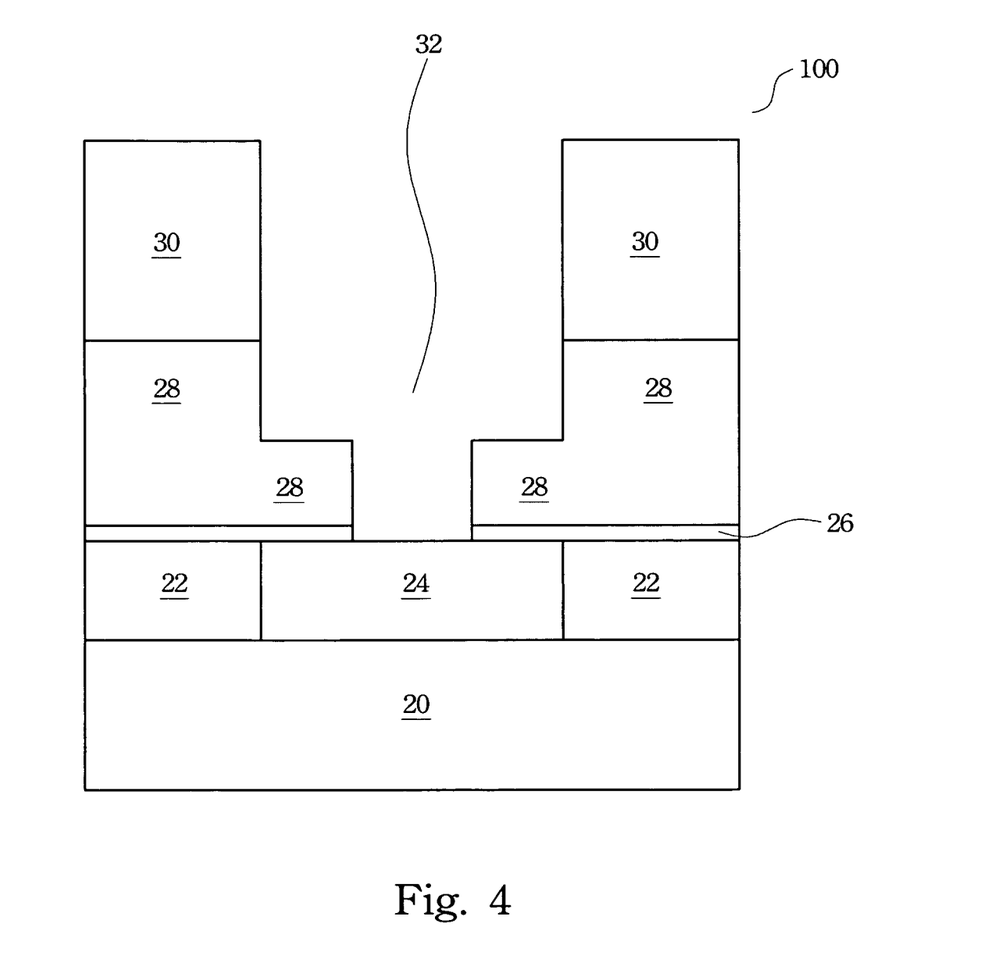

Referring to FIG. 4, photo resist 30 is formed over low-k dielectric layer 28. Optionally, bottom anti-reflective coating (BARC) or top anti-reflective coating (TARC) (not shown) may be formed under or over photo resist 30. Next, opening 32 is formed in low-k dielectric layer 28 to expose at least a portion of copper feature 24. In an exemplary embodiment, opening 32 is a trench opening for forming a metal line, and preferably has a width of less than about 130 nm. In this case, a single damascene process is involved. In other embodiments, opening 32 may include a via opening and a trench opening. In this case, a dual damascene process is involved, and two photo resists may be involved (including photo resist 30), one for forming the via opening, and one for forming the trench opening. In yet other embodiments, opening 32 is a contact opening. The formation process of opening 32 is well known in the art, and thus is not repeated herein.

Figure 5:
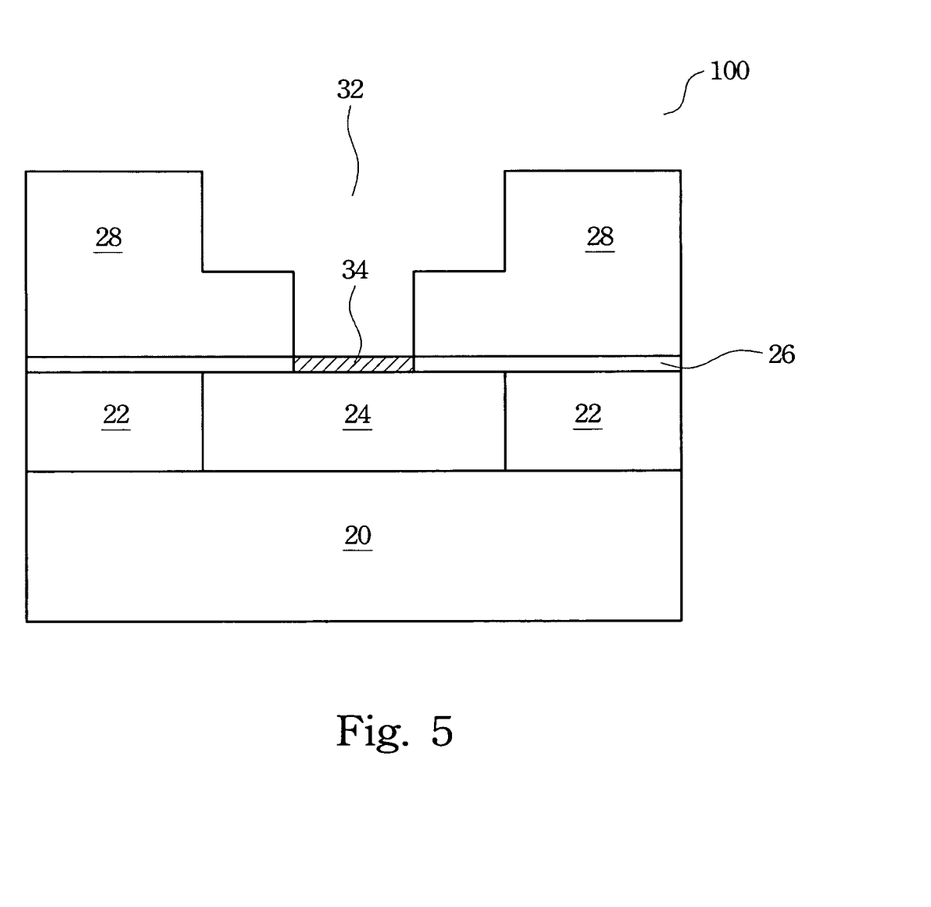

Next, photo resist 30 is removed, preferably by an ashing process, which may generate residues (not shown), for example, polymers. The resulting structure is shown in FIG. 5. The ashing process may use oxygen-containing process gases. Further, wafer 100 is exposed to oxygen and moisture after the formation of opening 32. A top layer of copper feature 24 thus reacts with oxygen and/or moisture, forming copper oxide layer 34. Copper oxide layer 34 adversely affects the electrical connection between copper feature 24 and the subsequently formed via and metal line in opening 32, and thus needs to be removed. As is known in the art, copper oxide layer 34 may be removed using furnace baking. In the embodiments of the present invention, however, no furnace baking is performed in a non-vacuum environment. Instead, copper oxide layer 34 will be removed in a vacuum environment.

Figure 6:
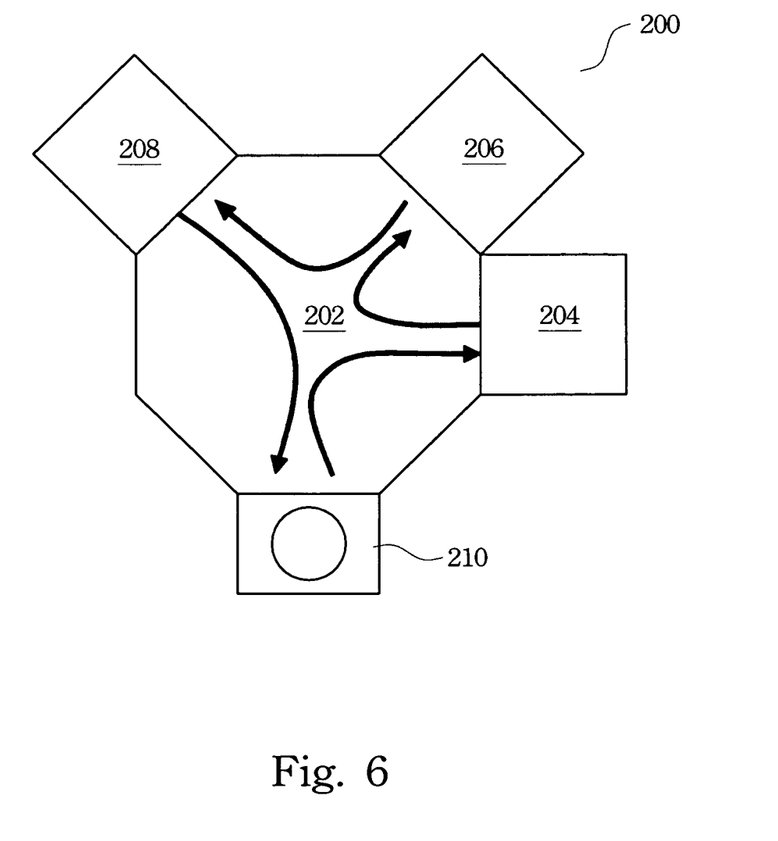
FIG. 6 illustrates a production tool for forming embodiments of the present invention.

FIG. 6 illustrates an exemplary production tool 200 for forming the embodiments of the present invention. Production tool 200 includes oxide-removal chamber 204 for removing copper oxide layers, deposition chamber 206 for forming barrier layers, deposition chamber 208 for forming seed layers, and transfer chamber 202 for transferring wafers between chambers 204, 206 and 208. Production tool 200 further includes loadlock 210 for loading wafers into, and unloading the wafers from, transfer chamber 202. During the transferring, chambers 202, 204, 206 and 208 preferably stay vacuumed. Accordingly, the oxide removal, barrier layer deposition and seed layer deposition may be performed in production tool 200 with no vacuum break occurring therebetween.

Wafer 100, which includes the structure as shown in FIG. 5, is first transferred into oxide-removal chamber 204 through loadlock 210. A copper oxide removal process is then performed. Preferably, in the copper oxide removal process, the oxide-removal chamber 204 is vacuumed. A process gas that can reduce copper oxide to copper, such as hydrogen, is introduced into oxide-removal chamber 204. Carrier gases such as nitrogen and/or argon, may be used. The oxide-removal chamber 204 preferably has a pressure of less than about 20 torrs, and more preferably between about 1 torr and about 8 torrs. In an exemplary embodiment, the pressure is about 2 torrs.

In the oxide-removal process, copper oxide is reduced to copper, while the oxygen in copper oxide layer 34 (refer to FIG. 5) forms water ($H_2O$) with hydrogen. The energy required for the reduction may be provided by heating wafer 100 with a heater, and hence the oxide-removal process may also be referred to as a baking process. Alternatively, lamps such as flash lamps may be used. Preferably, the heater and the lamps are used simultaneously. In the preferred embodiment, the temperature of wafer 100 is greater than about 150° C., and more preferably between about 200° C. and about 450° C., although the temperature may be higher or lower. In an exemplary embodiment, the temperature is about 350° C. It is realized that lower temperatures may cause the oxide-removal to last longer, while higher temperatures may require shorter oxide-removal times. One skilled in the art will be able to find the optimum temperature and time through experiments. At about 350° C., the oxide-removal process may take about one minute.

The oxide-removal process may also be performed using plasma or remote plasma, which provides the energy required for reacting oxygen and hydrogen. Again, hydrogen may be used. In the plasma or the remote plasma oxide-removal process, wafer 100 does not have to be, although it can be, heated.

In addition to the above-discussed oxide-removal process, a degas process may be performed, preferably in oxide-removal chamber 202. During the degas process, only gases that do not react with copper or copper oxide, such as nitrogen or argon are used, and wafer 100 is heated, for example, to about 200° C. and about 300° C., so that the moisture trapped in wafer 100 is released. Alternatively, a light re-sputtering of wafer 100 may be performed.

Figure 7:
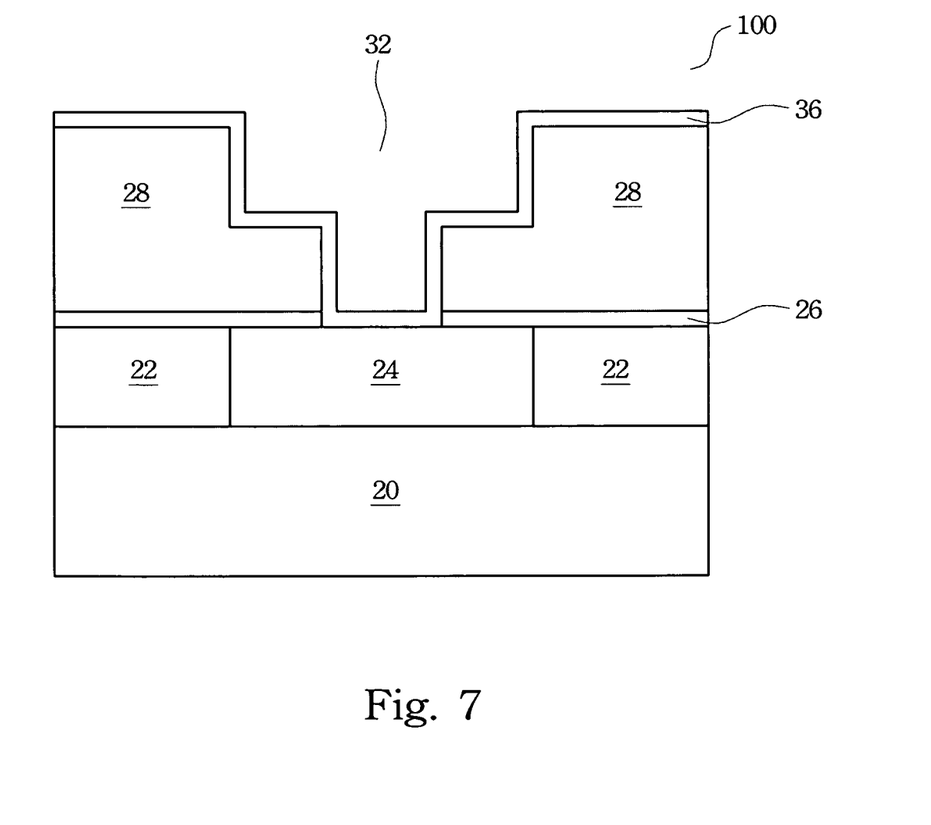

After the oxide-removal process, wafer 100 is transferred to deposition chamber 206 (refer to FIG. 6) to form diffusion barrier layer 36, as is shown in FIG. 7. Barrier layer 36 preferably includes titanium, titanium nitride, tantalum, tantalum nitride, ruthenium, ruthenium alloy, or other alternatives, and may be formed using physical vapor deposition (PVD) or one of the commonly used chemical vapor deposition (CVD) methods. The thickness of barrier layer 36 may be between about 20 Å and about 200 Å.

Figure 8:
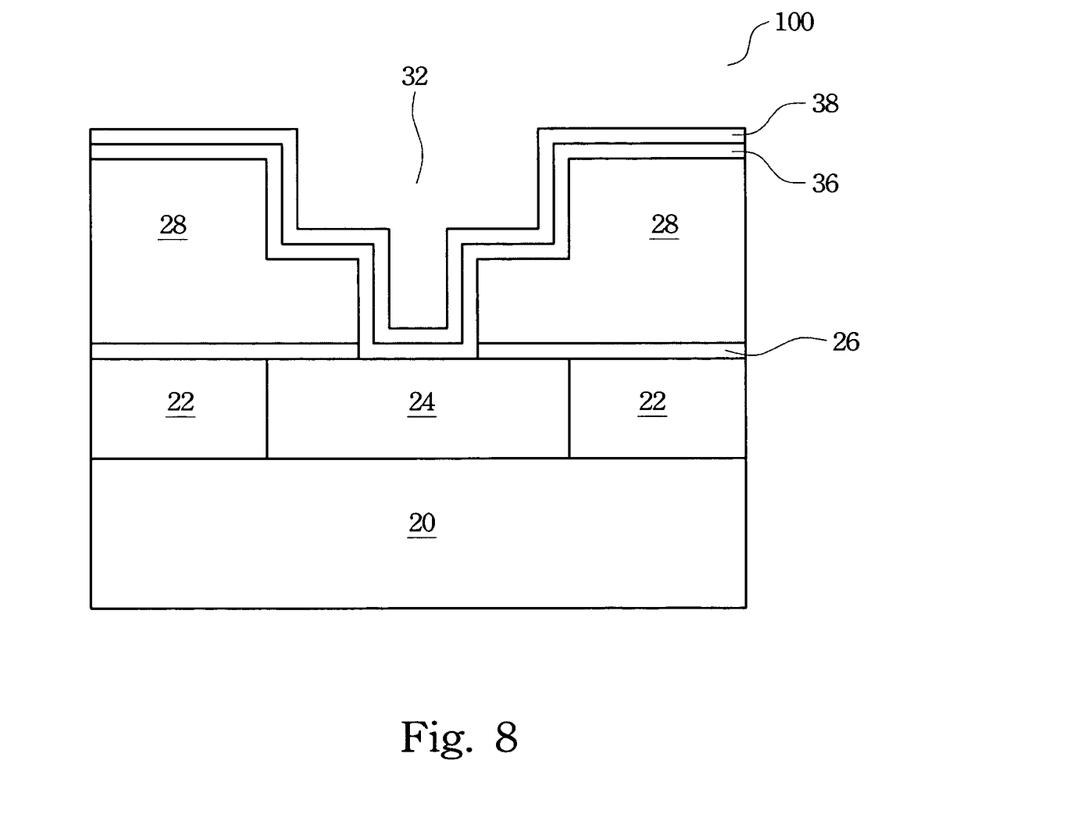

FIG. 8 illustrates the formation of seed layer 38. Seed layer 38 preferably includes copper or copper alloys, although it may also include ruthenium, or other applicable alternatives. The alloying material may include aluminum, silver, and the like. The thickness of seed layer 38 is preferably between about 20 Å and about 300 Å, although greater or smaller thicknesses may also be used. Preferably, seed layer 38 is formed using physical vapor deposition (PVD), which may include DC sputter, RF sputter, bias sputter, magnetron sputter, or the like. Alternatively, seed layer 38 may be formed using one of the chemical vapor deposition (CVD) methods.

During the transferring, chamber 202 and the chambers 204, 206 and 208 involved in the transferring preferably have a pressure of less than one atmosphere. It is appreciated that lower pressures during the wafer transfer reduce the likelihood of exposing copper line 24 and barrier layer 36 to detrimental substances such as oxygen and moisture, and hence lower pressures are preferred. Therefore, the pressure is preferably less than about 1 torr, and more preferably less than about $10^{-3}$ torrs, and even more preferably less than about $10^{-5}$ torrs. Preferably, during the entire process between the oxide-removal process starts and the formation of seed layer 38 finishes, no vacuum break occurs, and the pressure may be between about $10^{-3}$ torrs and about $10^{-5}$ torrs. In alternative embodiment, during the transferring, wafer 100 is only exposed to inert gases, such as nitrogen, argon, and the like, which may have a pressure of up to one atmosphere.

Figure 9:
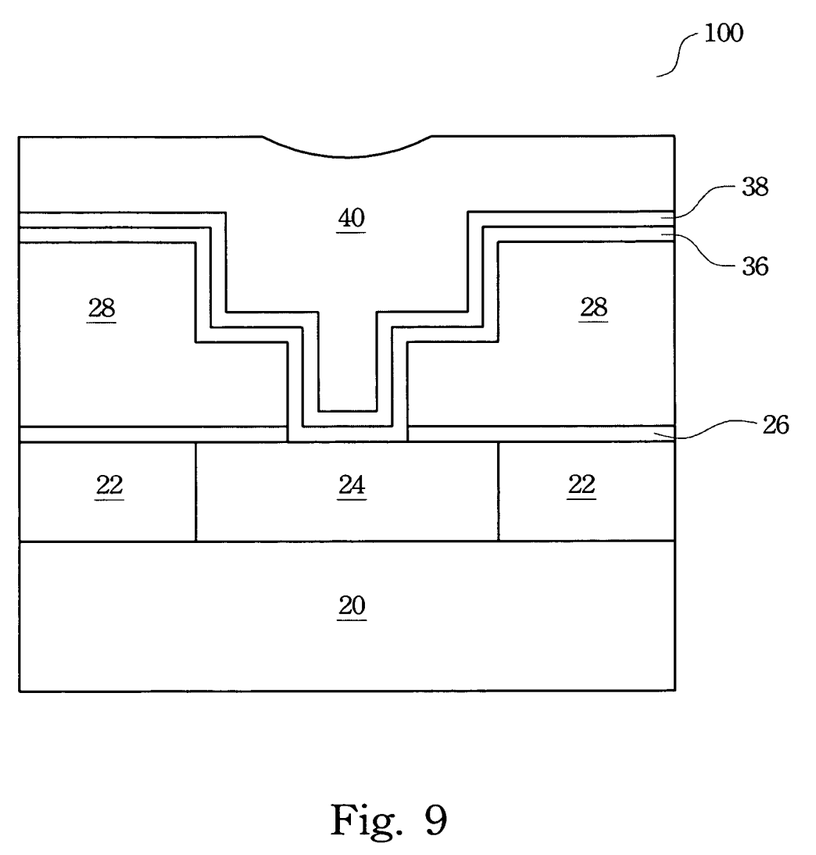

Next, as shown in FIG. 9, wafer 100 is unloaded from production tool 200 (refer to FIG. 6). Copper 40 is then filled into the remaining portion of opening 32. In the preferred embodiment, copper 40 is formed using electro plating by submerging wafer 100 into a plating solution containing ionized copper.

Figure 10:
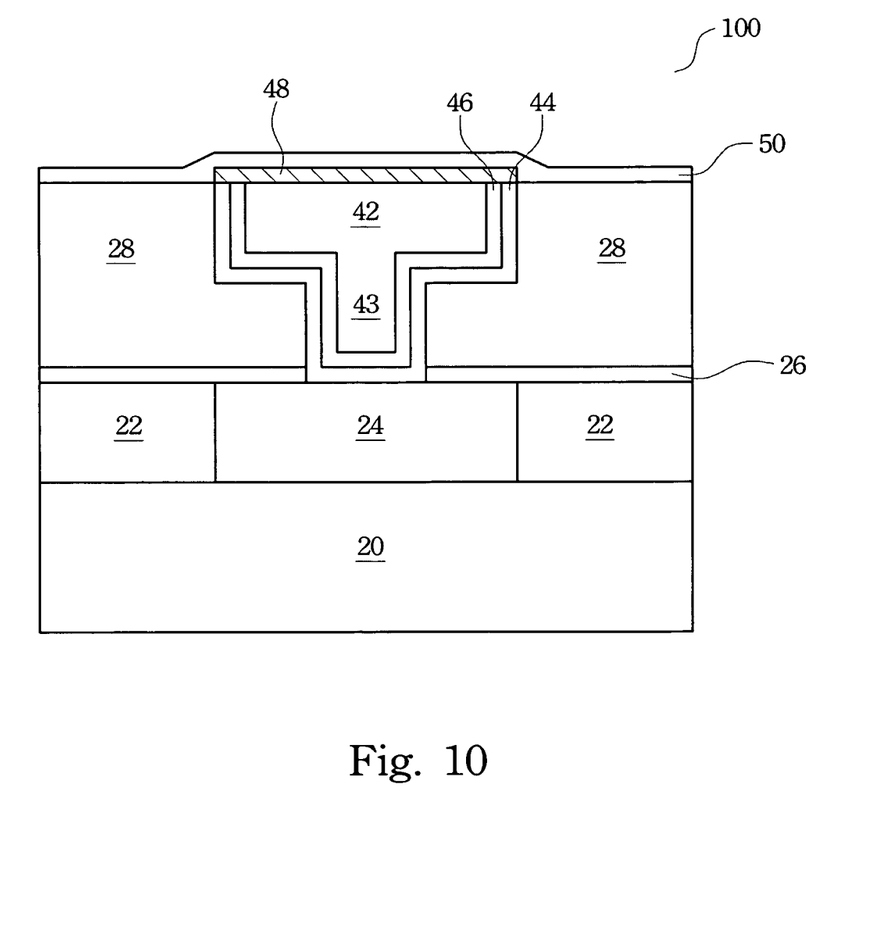

Referring to FIG. 10, a chemical mechanical polish (CMP) is performed to remove excess portions of copper 40, seed layer 38, and barrier layer 36 over low-k dielectric layer 28, leaving copper line 42, via 43, and corresponding portions of barrier layer 36 and seed layer 38 in opening 32. The remaining portion of barrier layer 36 and seed layer 38 are referred to as barrier layer 44 and seed layer 46, respectively.

FIG. 10 also illustrates the formation of metal cap 48 and etch stop layer (ESL) 50. Metal cap 48 may be formed of CoWP or other commonly used materials. ESL 50 may be formed of a dielectric material, preferably having a dielectric constant of greater than about 3.5, and may include materials such as silicon nitride, silicon carbide, silicon carbonitride, silicon carbon-oxide, $CH_x$, $CO_yH_x$, and combinations thereof. The details for forming metal cap 48 and ESL 50 are well known in the art, and hence are not repeated herein.

The embodiments of the present invention have several advantageous features. By performing the copper-oxide removal process in the vacuum environment, the resulting surface of copper is free from oxidation. The Q-time is substantially eliminated. Since the oxide-removal is only performed in the vacuum environment, the conventional furnace baking step is no longer needed, which not only reduces the hardware cost for the furnace baking, but also eliminates the time required for the furnace baking. The manufacturing throughput is thus increased. In addition, since the oxide-removal process is performed in a vacuum chamber with an elevated temperature, the residue of the PR ashing process may be removed more completely.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
   providing a substrate;
   forming a metal feature over the substrate;
   forming a dielectric layer over the metal feature;
   forming an opening in the dielectric layer, wherein at least a portion of the metal feature is exposed through the opening, and wherein an oxide layer is formed on an exposed portion of the metal feature;
   in a production tool having a vacuum environment, performing an oxide-removal process to remove the oxide layer, wherein between the step of forming the opening and the oxide-removal process, no additional oxide-removal process is performed to the metal feature outside the production tool;
   after performing the oxide-removal process, releasing moisture trapped in the substrate by performing a degas process using one or more gases that do not react with the metal feature;
   in the production tool, forming a diffusion barrier layer in the opening; and
   in the production tool, forming a seed layer on the diffusion barrier layer.

2. The method of claim 1, wherein no vacuum-break occurs between the steps of performing the oxide-removal process and forming the seed layer.

3. The method of claim 2, wherein the steps of performing the oxide-removal process, forming the diffusion barrier layer, and forming the seed layer are performed in different chambers of the production tool, and wherein when the substrate is transferred between the different chambers, the production tool has a pressure of lower than about 1 torr.

4. The method of claim 1, wherein the metal feature comprises copper.

5. The method of claim 1, wherein the oxide-removal process comprises reducing the oxide layer to metal.

6. The method of claim 5, wherein the step of reducing the oxide layer comprises baking the substrate in a hydrogen-containing environment.

7. A method of forming an integrated circuit structure, the method comprising:
   providing a substrate;
   forming a metal feature over the substrate;
   forming a dielectric layer over the metal feature;
   forming an opening in the dielectric layer, wherein at least a portion of the metal feature is exposed through the opening, and wherein an oxide layer is formed on an exposed portion of the metal feature;
   in a production tool having a vacuum environment, baking the substrate, wherein a process gas for reducing the oxide layer to metal is introduced to the production tool when the substrate is being baked;
   releasing moisture trapped in the substrate by performing, after the baking, a degas process, the degas process using one or more gases that do not react with material of the metal feature;
   forming a diffusion barrier layer in the opening; and
   forming a seed layer on the diffusion barrier layer, wherein the steps of forming the diffusion barrier layer and forming the seed layer are performed in the production tool.

8. The method of claim 7, wherein the process gas used for baking the substrate comprises hydrogen.

9. The method of claim 7, wherein between the step of forming the opening and the step of baking the substrate in the production tool, the oxide layer is free from reduction steps.

10. The method of claim 7, wherein the steps of baking the substrate, forming the diffusion barrier layer, and forming the seed layer are each formed in a first, a second, and a third chamber of the production tool, respectively.

11. The method of claim 10, wherein between the steps of forming the diffusion barrier layer and forming the seed layer, the substrate is transferred through a transfer chamber having a pressure of less than about 1 torr.

12. The method of claim 11, wherein during the step of baking the substrate, the first chamber has a pressure of less than about 20 torrs.

13. The method of claim 7 further comprising, after forming the seed layer, taking the substrate out of the production tool, and performing a plating to fill the remaining portion of the opening.

14. A method of forming an integrated circuit structure, the method comprising:
   providing a substrate;
   providing a production tool comprising a baking chamber, a first and a second deposition chamber, and a transfer chamber for transferring wafers between the baking chamber and the first and the second deposition chambers;
   forming a first dielectric layer over the substrate;
   forming a copper line in the first dielectric layer;
   forming a second dielectric layer over the copper line and the first dielectric layer, wherein the second dielectric layer has a low k value;
   forming an opening in the second dielectric layer, wherein at least a portion of the copper line is exposed through the opening, and wherein a copper oxide layer is formed on an exposed portion of the copper line;
   baking the substrate in the baking chamber of the production tool, wherein hydrogen is introduced into the first deposition chamber during the step of baking;
   releasing moisture trapped in the substrate by performing, after the baking, a degas process using one or more gases non-reactive with copper and copper oxide;
   transferring the substrate from the baking chamber to the first deposition chamber through the transfer chamber, wherein no vacuum break occurs in the production tool;
   in the first deposition chamber, forming a diffusion barrier layer in the opening;
   transferring the substrate from the first deposition chamber to the second deposition chamber through the transfer chamber, wherein no vacuum break occurs in the production tool;
   in the second deposition chamber, forming a seed layer on the diffusion barrier layer; and
   plating copper on the seed layer to fill the opening.

15. The method of claim 14, wherein during the step of transferring the substrate from the baking chamber to the first deposition chamber and the step of transferring the substrate from the first deposition chamber to the second deposition chamber, the transfer chamber has a pressure of less than about 1 torr.

16. The method of claim 14, wherein during the step of baking the substrate, the baking chamber has a pressure of less than about 20 torrs, and the substrate has a temperature of higher than about 150° C.

17. The method of claim 14, wherein between the step of forming the opening and the step of baking the substrate in the baking chamber, the substrate is free from being baked in hydrogen-containing processes.

18. The method of claim 14 further comprising performing a planarization to remove excess copper outside of the opening.

19. The method of claim 7, wherein the one or more gases used in the degas process comprise nitrogen or argon.

20. The method of claim 14, wherein the one or more gases used in the degas process comprises nitrogen or argon.

* * * * *

UNITED STATES PATENT AND TRADEMARK OFFICE
CERTIFICATE OF CORRECTION

PATENT NO. : 8,470,390 B2  
APPLICATION NO. : 11/972785  
DATED : June 25, 2013  
INVENTOR(S) : Wang et al.

Page 1 of 1

It is certified that error appears in the above-identified patent and that said Letters Patent is hereby corrected as shown below:

In the Claims:

In Col. 8, line 20, Claim 12, delete "toms" and insert --torrs--.

Signed and Sealed this  
Sixth Day of August, 2013

Teresa Stanek Rea  
*Acting Director of the United States Patent and Trademark Office*